US012761563B2

(12) United States Patent
Heo et al.

(10) Patent No.: US 12,761,563 B2
(45) Date of Patent: Oct. 13, 2026

(54) METAL CONTAINING PHOTORESIST DEVELOPER COMPOSITION, AND METHOD OF FORMING PATTERNS INCLUDING STEP OF DEVELOPING USING THE COMPOSITION

(71) Applicant: SAMSUNG SDI CO., LTD., Yongin-si (KR)

(72) Inventors: Ryunmin Heo, Suwon-si (KR); Jin-Hee Bae, Suwon-si (KR); Hyungrang Moon, Suwon-si (KR); Taeksoo Kwak, Suwon-si (KR); Gyeong Ryeong Bak, Suwon-si (KR); Chungheon Lee, Suwon-si (KR); Byeonggyu Hwang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 596 days.

(21) Appl. No.: 18/321,596

(22) Filed: May 22, 2023

(65) Prior Publication Data

US 2024/0019784 A1 Jan. 18, 2024

(30) Foreign Application Priority Data

Jul. 5, 2022 (KR) ........................ 10-2022-0082642

(51) Int. Cl.
*G03F 7/32* (2006.01)
*G03F 7/004* (2006.01)

(52) U.S. Cl.
CPC ............ *G03F 7/325* (2013.01); *G03F 7/0042* (2013.01)

(58) Field of Classification Search
CPC ........ G03F 7/325; G03F 7/0042; G03F 7/322; G03F 7/42; G03F 7/004; G03F 7/40; G03F 7/32; G03F 7/20; G03G 9/12
See application file for complete search history.

(56) References Cited

U.S. PATENT DOCUMENTS

2004/0170931 A1* 9/2004 Suzuki .................... G03F 7/325
430/465
2004/0224866 A1 11/2004 Matsunaga et al.
(Continued)

FOREIGN PATENT DOCUMENTS

CN 1618042 A 5/2005
JP S59-142547 A 8/1984
(Continued)

OTHER PUBLICATIONS

Office Action (including a search report) dated Dec. 13, 2023, of the corresponding Taiwanese Patent Application No. 112116141 (7 pages).

(Continued)

*Primary Examiner* — Stewart A Fraser
(74) *Attorney, Agent, or Firm* — Womble Bond Dickinson (US) LLP

(57) ABSTRACT

A metal-containing photoresist developer composition includes an organic solvent, and at least one additive selected from a phosphorous acid-based compound, a hypophosphorous acid-based compound, a sulfurous acid-based compound, and a hydroxamic acid-based compound, wherein the additive is included in an amount of about 0.0001 wt % to less than about 1.0 wt %. A method of forming patterns includes step of developing a metal-containing photoresist film using the metal-containing photoresist developer composition.

6 Claims, 1 Drawing Sheet

(56) References Cited

U.S. PATENT DOCUMENTS

| | | | | |
|---|---|---|---|---|
| 2005/0112503 | A1 | 5/2005 | Kanda et al. | |
| 2005/0130082 | A1 | 6/2005 | Kanda et al. | |
| 2005/0176607 | A1 | 8/2005 | Ahn et al. | |
| 2010/0152085 | A1 | 6/2010 | Shimada et al. | |
| 2013/0014658 | A1 | 1/2013 | Sato et al. | |
| 2018/0173096 | A1* | 6/2018 | Zi | G03F 7/0047 |
| 2021/0132503 | A1 | 5/2021 | Oomatsu et al. | |
| 2021/0134589 | A1* | 5/2021 | Weng | G03F 7/0025 |
| 2021/0364924 | A1 | 11/2021 | Liu et al. | |
| 2023/0143629 | A1* | 5/2023 | Clark | G03F 7/36 430/5 |
| 2023/0266670 | A1* | 8/2023 | Hansen | G03F 7/167 430/331 |

FOREIGN PATENT DOCUMENTS

| | | | |
|---|---|---|---|
| JP | 4472369 | B2 | 6/2010 |
| JP | 201233774 | A | 2/2012 |
| JP | 5407121 | B2 | 2/2014 |
| JP | 2018-44202 | A | 3/2018 |
| JP | 2023-52469 | A | 4/2023 |
| JP | 2023-87948 | A | 6/2023 |
| KR | 10-0571721 | B1 | 4/2006 |
| KR | 10-2007-0023004 | A | 2/2007 |
| KR | 10-1047776 | B1 | 7/2011 |
| KR | 10-1264439 | B1 | 5/2013 |
| KR | 10-1330509 | B1 | 11/2013 |
| KR | 10-1557771 | B1 | 10/2015 |
| TW | 200301409 | A | 7/2003 |
| TW | 202119139 | A | 5/2021 |
| TW | 202144934 | A | 12/2021 |

OTHER PUBLICATIONS

Office Action dated Jan. 16, 2024, of the corresponding Japanese Patent Application No. 2023-070735 (4 pages).

Korean Office Action dated Nov. 10, 2024, of the corresponding Korean Patent Application No. 10-2022-0082642 1 (6 pages).

* cited by examiner

METAL CONTAINING PHOTORESIST DEVELOPER COMPOSITION, AND METHOD OF FORMING PATTERNS INCLUDING STEP OF DEVELOPING USING THE COMPOSITION

CROSS-REFERENCE TO RELATED APPLICATION

This application claims priority to and the benefit of Korean Patent Application No. 10-2022-0082642, filed in the Korean Intellectual Property Office on Jul. 5, 2022, the entire content of which is incorporated herein by reference.

BACKGROUND

1. Field

One or more aspects of embodiments of this disclosure relate to a metal-containing photoresist developer composition and a method of forming patterns including a developing step using the same.

2. Description of the Related Art

In recent years, a semiconductor industry has been accompanied by a continuous reduction of critical dimensions (e.g., a reduction in size of semiconductor components), and this dimensional reduction requires new types (or kinds) of high-performance photoresist materials and a patterning method that satisfy a demand or desire for processing and patterning components with increasingly smaller features.

Related art chemically amplified (CA) photoresists are designed to secure high sensitivity, but because a typical (e.g., common) elemental makeup thereof (mainly C (carbon) with smaller quantities of O, F, and S) lowers absorbance of light at a wavelength of about 13.5 nm, sensitivity may be reduced as a result, and the photoresists may suffer more difficulties partially under the EUV (extreme ultraviolet light) exposure. In addition, the CA photoresists may have difficulties due to roughness issues in small feature sizes. For example, due partially to the nature of acid catalyst processes that may be utilized in EUV lithography, LER (line edge roughness) experimentally turns out to increase as photospeed decreases. Due to these drawbacks and problems of the CA photoresists, a new type (or kind) of high-performance photoresists is required or desired in the semiconductor industry.

In particular, it is necessary or desired to develop a photoresist securing excellent or suitable etching resistance and resolution and simultaneously (e.g., concurrently), improving sensitivity and enhancing CD (critical dimension) uniformity and LER (line edge roughness) characteristics in the photolithography process.

SUMMARY

One or more embodiments provides a developer composition for developing the metal-containing photoresist.

One or more embodiments provides a method of forming patterns including a step of developing using the composition.

The developer composition for developing the metal-containing photoresist (herein, the metal-containing photoresist developer composition) according to one or more embodiments may include an organic solvent, and at least one additive selected from a phosphorous acid-based compound, a hypophosphorous acid-based compound, a sulfurous acid-based compound, and a hydroxamic acid-based compound, wherein the additive is included in an amount of about 0.0001 wt % to less than about 1.0 wt %.

The additive may be included in an amount of less than or equal to about 0.5 wt %.

The phosphorous acid-based compound may be at least one of phosphonic acid, methyl phosphonic acid, ethyl phosphonic acid, butyl phosphonic acid, hexyl phosphonic acid, n-octyl phosphonic acid, tetradecyl phosphonic acid, octadecyl phosphonic acid, phenyl phosphonic acid, vinyl phosphonic acid, aminomethyl phosphonic acid, methylene diamine tetramethylene phosphonic acid, ethylene diamine tetramethylene phosphonic acid, 1-amino 1-phosphonooctyl phosphonic acid, etidronic acid, 2-aminoethyl phosphonic acid, 3-aminopropyl phosphonic acid, 6-hydroxyl hexyl phosphonic acid, decyl phosphonic acid, methylene diphosphonic acid, nitrilotriethylene trisphosphonic acid, 1H,1H,2H,2H-perfluorooctanephosphonic acid, or a combination thereof.

The hypophosphorous acid-based compound may be at least one of diphenylphosphinic acid, bis(4-methoxyphenyl) phosphinic acid, phosphinic acid, bis(hydroxymethyl)phosphinic acid, phenylphosphinic acid, p-(3-aminopropyl)-p-butylphosphinic acid, or a combination thereof.

The sulfurous acid-based compound may be at least one of vinylsulfonic acid, 2-propene-1-sulfonic acid, methanesulfonic acid, ethanesulfonic acid, propanesulfonic acid, 3-hydroxypropane-1-sulfonic acid, benzenesulfonic acid, 4-hydroxybenzenesulfonic acid, p-toluenesulfonic acid, or combination thereof.

The hydroxamic acid-based compound may be at least one of formohydroxamic acid, acetohydroxamic acid, benzohydroxamic acid, salicylhydroxamic acid, 2-aminobenzohydroxamic acid, 2-chlorobenzohydroxamic acid, 2-fluorobenzohydroxamic acid, 2-nitrobenzohydroxamic acid, 3-nitrobenzohydroxamic acid, 4-aminobenzohydroxamic acid, 4-chlorobenzohydroxamic acid, 4-fluorobenzohydroxamic acid, 4-nitrobenzohydroxamic acid, or a combination thereof.

The metal-containing photoresist may include at least one metal compound selected from a tin compound containing an organic oxy group and a tin compound containing an organic carbonyl oxy group.

The metal-containing photoresist may include a metal compound represented by Chemical Formula 1.

Chemical Formula 1

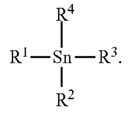

In Chemical Formula 1, $R^1$ may be selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group, and —$R^a$—O—$R^b$ (wherein $R^a$ may be a substituted or unsubstituted C1 to C20 alkylene group and $R^b$ is a substituted or unsubstituted C1 to C20 alkyl group), $R^2$ to $R^4$ may be each independently selected from —$R^c$ or —OC(=O)$R^d$, $R^c$ may be a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^d$ may be hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

A method of forming patterns according to one or more embodiments includes coating a metal-containing photoresist composition on a substrate, coating a composition for removing edge beads from a metal-containing photoresist along an edge of the substrate to form a resultant, drying and heating the resultant to form a metal-containing photoresist film on the substrate, exposing the metal-containing photoresist film, and developing the metal-containing photoresist film utilizing the metal-containing photoresist developer composition.

The metal-containing photoresist developer composition according to the embodiments minimizes or reduces defects present in the metal-containing photoresist film after the exposure process and enables easy development, thereby realizing excellent or improved contrast characteristics, excellent or improved sensitivity, and reduced line edge roughness (LER).

DETAILED DESCRIPTION

Figure 1:
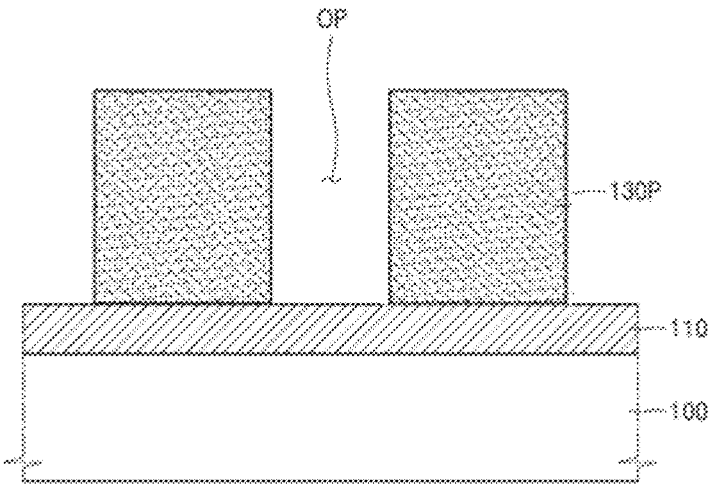
FIGS. 1-3 are cross-sectional views illustrating acts in a process sequence of a method of forming patterns according to the present embodiments.

Hereinafter, embodiments of the present disclosure will be described in more detail with reference to the accompanying drawings. In the following description of the present disclosure, the well-known functions or constructions will not be described in order to clarify (focus on) the present disclosure.

In order to clearly illustrate the present disclosure, certain description and relationships may be omitted, and throughout the disclosure, the same or similar configuration of elements are designated by the same reference numerals. The size and thickness of each configuration shown in the drawing are arbitrarily shown for better understanding and ease of description, and the present disclosure is not necessarily limited thereto.

In the drawings, the thickness of layers, films, panels, regions, etc., may be exaggerated for clarity. In the drawings, the thickness of a part (or portion) of a layer or region, etc., may be exaggerated for clarity. It will be understood that when an element such as a layer, film, region, or substrate is referred to as being "on" another element, it can be directly on the other element (e.g., without any intervening elements therebetween) or intervening elements may also be present.

It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element.

As used herein, the singular forms "a," "an," and "the" are intended to include the plural forms as well, unless the context clearly indicates otherwise. Furthermore, any element in a claim that does not explicitly state "means for" performing a specified function, or "step for" performing a specific function, is not to be interpreted as a "means" or "step" clause as specified in 35 U.S.C. § 112(f). In particular, the use of "step of" or "act of" in the claims herein is not intended to invoke the provisions of 35 U.S.C. § 112(f).

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one selected from a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items. Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the present disclosure, the term "substituted" refers to replacement of a hydrogen atom by deuterium, a halogen group, a hydroxyl group, an amino group, a substituted or unsubstituted C1 to C30 amine group, a nitro group, a substituted or unsubstituted C1 to C40 silyl group, a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, or a cyano group. The term "unsubstituted" means that a hydrogen atom remains as a hydrogen atom without being replaced by another substituent.

In the present disclosure, the term "alkyl group" means a linear or branched aliphatic hydrocarbon group, unless otherwise defined. The alkyl group may be a "saturated alkyl group" that does not contain any double or triple bonds.

The alkyl group may be a C1 to C20 alkyl group. For example, the alkyl group may be a C1 to C10 alkyl group or a C1 to C6 alkyl group. For example, a C1 to C4 alkyl group means that the alkyl chain contains 1 to 4 carbon atoms, and may be selected from methyl, ethyl, propyl, iso-propyl, n-butyl, iso-butyl, sec-butyl, and t-butyl.

Examples of the alkyl group may include a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, etc.

In the present disclosure, the term "cycloalkyl group," unless otherwise defined, refers to a monovalent cyclic aliphatic hydrocarbon group unless otherwise defined.

In the present disclosure, the term "alkenyl group," unless otherwise defined, is a linear or branched aliphatic hydrocarbon group, and refers to an aliphatic unsaturated alkenyl group containing one or more double bonds.

In the present disclosure, the term "alkynyl group," unless otherwise defined, is a linear or branched aliphatic hydrocarbon group, and refers to an unsaturated alkynyl group containing one or more triple bonds.

In the present disclosure, the term "aryl group" means a substituent in which all elements of a cyclic substituent have p-orbitals, and these p-orbitals form a conjugate. It may include monocyclic or fused ring polycyclic (i.e., rings that share adjacent pairs of carbon atoms) functional groups.

Hereinafter, a metal-containing photoresist developer composition according to one or more embodiments is described.

A metal-containing photoresist developer composition according to one or more embodiments of the present disclosure includes an organic solvent, and at least one additive selected from a phosphorous acid-based compound, a hypophosphorous acid-based compound, a sulfurous acid-based compound, and a hydroxamic acid-based compound, wherein the additive is included in an amount of about 0.0001 wt % to less than about 1.0 wt %.

Within the above range, the additive may be included in an amount of less than or equal to about 0.9 wt %, for example, less than or equal to about 0.8 wt %, less than or equal to about 0.7 wt %, or less than or equal to about 0.6 wt %, and in some embodiments, less than or equal to about 0.5 wt %.

For example, the metal-containing photoresist developer composition includes the organic solvent in an amount of greater than about 95.5 wt % and less than about 99.9999 wt % and the additive in an amount of about 0.0001 wt % to about 0.5 wt %.

By applying the metal-containing photoresist developer composition of the present embodiments, defects present in the metal-containing photoresist film after the exposure process may be minimized or reduced and the metal-containing photoresist film may be developed relatively easily, thereby realizing excellent or suitable contrast characteristics.

In addition, excellent or suitable sensitivity and reduced line edge roughness (LER) may be realized.

By way of contrast, organic acid has no (or substantially no) effect of improving pattern-forming capability, even by adjusting its content and/or the content of the additive. However, when at least one additive selected from a phosphorous acid-based compound, a hypophosphorous acid-based compound, a sulfurous acid-based compound, and a hydroxamic acid-based compound according to the present disclosure is included, the content of the additive may be adjusted into a range of about 0.0001 wt % to about 0.5 wt %, thus significantly improving the pattern-forming capability.

For example, the phosphorous acid-based compound may be at least one of phosphonic acid, methyl phosphonic acid, ethyl phosphonic acid, butyl phosphonic acid, hexyl phosphonic acid, n-octyl phosphonic acid, tetradecyl phosphonic acid, octadecyl phosphonic acid, phenyl phosphonic acid, vinyl phosphonic acid, aminomethyl phosphonic acid, methylene diamine tetramethylene phosphonic acid, ethylene diamine tetramethylene phosphonic acid, 1-amino 1-phosphonooctyl phosphonic acid, etidronic acid, 2-aminoethyl phosphonic acid, 3-aminopropyl phosphonic acid, 6-hydroxyl hexyl phosphonic acid, decyl phosphonic acid, methylene diphosphonic acid, nitrilotriethylene trisphosphonic acid, 1H,1H,2H,2H-perfluorooctanephosphonic acid, or a combination thereof.

For example, the hypophosphorous acid-based compound may be at least one of diphenylphosphinic acid, bis(4-methoxyphenyl) phosphinic acid, phosphinic acid, bis(hydroxymethyl)phosphinic acid, phenylphosphinic acid, p-(3-aminopropyl)-p-butylphosphinic acid, or a combination thereof.

For example, the sulfurous acid-based compound is at least one of vinylsulfonic acid, 2-propene-1-sulfonic acid, methanesulfonic acid, ethanesulfonic acid, propanesulfonic acid, 3-hydroxypropane-1-sulfonic acid, benzenesulfonic acid, 4-hydroxybenzenesulfonic acid, p-toluenesulfonic acid, or combination thereof.

For example, the hydroxamic acid-based compound may be at least one of formohydroxamic acid, acetohydroxamic acid, benzohydroxamic acid, salicylhydroxamic acid, 2-aminobenzohydroxamic acid, 2-chlorobenzohydroxamic acid, 2-fluorobenzohydroxamic acid, 2-nitrobenzohydroxamic acid, 3-nitrobenzohydroxamic acid, 4-aminobenzohydroxamic acid, 4-chlorobenzohydroxamic acid, 4-fluorobenzohydroxamic acid, 4-nitrobenzohydroxamic acid, or a combination thereof.

Examples of the organic solvent included in the metal-containing photoresist developer composition according to the embodiments may include at least one selected from ether, alcohol, glycol ether, aromatic hydrocarbon compounds, ketone, and ester, but are not limited thereto. For example, the organic solvent may include ethyleneglycolmonomethylether, ethyleneglycolmonoethylether, methylcellosolveacetate, ethylcellosolveacetate, diethyleneglycolmethylether, diethyleneglycolethylether, propyleneglycol, propyleneglycolmethylether (PGME), propyleneglycolmethyletheracetate (PG MEA), propyleneglycolethylether, propyleneglycolethyletheracetate, propyleneglycolpropyletheracetate, propyleneglycolbutylether, propyleneglycolbutyletheracetate, ethanol, propanol, isopropylalcohol, isobutylalcohol, 4-methyl-2-pentenol (may be referred to as methyl isobutyl carbinol (MIBC)), hexanol, 1-methoxy-2-propanol, 1-ethoxy-2-propanol, ethyleneglycol, propyleneglycol, heptanone, propylenecarbonate, butylene carbonate, toluene, xylene, methylethylketone, cyclopentanone, cyclohexanone, 2-hydroxy ethyl propionate, 2-hydroxy-2-methyl ethyl propionate, ethoxy ethyl acetate, hydroxy ethyl acetate, 2-hydroxy-3-methylmethyl butanoate, 3-methoxy methyl propionate, 3-methoxy ethyl propionate, 3-ethoxy ethyl propionate, 3-ethoxy methyl propionate, methyl pyruvate, ethyl pyruvate, ethyl acetate, butyl acetate, ethyl lactate, butyl lactate, gamma-butyrolactone, methyl-2-hydroxyisobutyrate, methoxybenzene, n-butyl acetate, 1-methoxy-2-propyl acetate, methoxyethoxy propionate, ethoxyethoxy propionate, or a combination thereof, but is not limited thereto.

When the other additives to be described herein below are included, the organic solvent may be included in a balance amount except for the components included in the composition (e.g., the organic solvent may comprise or be composed of the remaining balance of the additive composition).

The metal-containing photoresist developer composition according to the present disclosure may further include at least one other additive selected from a surfactant, a dispersant, a moisture absorbent, and a coupling agent.

The surfactant may serve to improve coating uniformity and improve wetting of the photoresist composition. In some embodiments, the surfactant may be a sulfuric acid ester salt, a sulfonic acid salt, a phosphoric acid ester, a soap, an amine salt, a quaternary ammonium salt, a polyethylene glycol, an alkylphenol ethylene oxide adduct, a polyhydric alcohol, a nitrogen-containing vinyl polymer, or a combination thereof, but is not limited thereto. For example, the surfactant may include an alkylbenzenesulfonate salt, an alkylpyridinium salt, polyethylene glycol, and/or a quaternary ammonium salt. When the photoresist composition includes the surfactant, the surfactant may be included in an amount of about 0.001 wt % to about 3 wt % based on the total weight of the photoresist composition.

The dispersant may serve to substantially uniformly disperse each component constituting the photoresist composition in the photoresist composition. In one or more embodiments, the dispersant may be an epoxy resin, polyvinyl alcohol, polyvinyl butyral, polyvinylpyrrolidone, glucose, sodium dodecyl sulfate, sodium citrate, oleic acid, linoleic acid, or a combination thereof, but is not limited thereto. When the photoresist composition includes the dispersant, the dispersant may be included in an amount of about 0.001 wt % to about 5 wt % based on the total weight of the photoresist composition.

The moisture absorbent may serve to prevent or reduce adverse effects by moisture in the photoresist composition. For example, the moisture absorbent may serve to prevent or reduce the oxidation by moisture of the metal included in the photoresist composition. In one or more embodiments, the moisture absorbent may be polyoxyethylene nonylphenylether, polyethylene glycol, polypropylene glycol, polyacrylamide, or a combination thereof, but is not limited thereto. When the photoresist composition includes the moisture absorbent, the moisture absorbent may be included in an amount of about 0.001 wt % to about 10 wt % based on the total weight of the photoresist composition.

The coupling agent may serve to improve adhesion to the lower film when the photoresist composition is coated on the lower film. In one or more embodiments, the coupling agent may include a silane coupling agent. The silane coupling agent may be vinyltrimethoxysilane, vinyltriethoxysilane, vinyl trichlorosilane, vinyltris(p-methoxyethoxy)silane, 3-methacryloxypropyltrimethoxysilane, 3-acryloxypropyl trimethoxysilane, p-styryl trimethoxysilane, 3-methacryloxypropylmethyldimethoxysilane, 3-methacryloxypropylmethyldiethoxysilane, and/or trimethoxy[3-(phenylamino)propyl]silane, but is not limited thereto. When the photoresist composition includes the coupling agent, the coupling agent may be included in an amount of about 0.001 wt % to about 5 wt % based on the total weight (at 100 wt %) of the photoresist composition.

The metal-containing photoresist may include at least one metal compound selected from a tin compound containing an organic oxy group and a tin compound containing an organic carbonyl oxy group.

For example, the tin compound containing an organic oxy group may be an alkyl tin oxo group.

For example, the tin compound containing an organic carbonyl oxy group may be an alkyl tin carboxyl group.

For example, the metal-containing photoresist may include a metal compound represented by Chemical Formula 1.

Chemical Formula 1

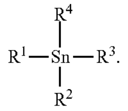

In Chemical Formula 1, $R^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group, or —$R^d$—O—$R^b$ (wherein $R^a$ is a substituted or unsubstituted C1 to C20 alkylene group and $R^b$ is a substituted or unsubstituted C1 to C20 alkyl group), $R^2$ to $R^4$ are each independently selected from —$OR^c$ and/or —OC(═O)$R^d$, $R^c$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^d$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

For example, $R^c$ is a substituted or unsubstituted C1 to C20 alkyl group.

$R^d$ is hydrogen, or a substituted or unsubstituted C1 to C20 alkyl group.

According to one or more embodiments, a method of forming patterns includes the step of development using the aforementioned metal-containing photoresist developer composition. For example, the manufactured pattern may be a negative-type (e.g., negative) photoresist pattern.

A method of forming patterns according to one or more embodiments includes coating a metal-containing photoresist composition on a substrate, coating the composition for removing edge beads from the metal-containing photoresist along the edge of the substrate, drying and heating the resultant to form a metal-containing photoresist film on the substrate, exposing the metal-containing photoresist film, and developing the same using the metal-containing photoresist developer composition.

In one or more embodiments, the forming of patterns using the metal-containing photoresist composition may include coating a metal-containing photoresist composition on a substrate by spin coating, slit coating, inkjet printing, etc. to form a thin film on the substrate, and drying the coated metal-containing photoresist composition to form a photoresist film. The metal-containing photoresist composition may include a tin-based compound, and for example, the tin-based compound may include at least one selected from an alkyl tin oxo group, an alkyl tin carboxyl group, and an alkyl tin hydroxy group.

Subsequently, the composition for removing edge beads from the metal-containing photoresist may be coated along the edge of the substrate.

Next, a first heat treatment process of heating the substrate on which the metal-containing photoresist film is formed is performed. The first heat treatment process may be performed at a temperature of about 80° C. to about 120° C. In this process, the solvent is evaporated and the metal-containing photoresist film may be more firmly adhered to the substrate.

Next, the photoresist film is selectively exposed.

For example, examples of light that may be used in the exposure process of the photoresist film may include not only light having a short wavelength such as i-line (wavelength 365 nm), KrF excimer laser (wavelength of 248 nm), ArF excimer laser (wavelength of 193 nm), but also light having a high energy wavelength such as EUV (Extreme UltraViolet, wavelength of 13.5 nm), E-Beam (electron beam), etc.

For example, the light for exposure according to one or more embodiments may be short-wavelength light having a wavelength range of about 5 nm to about 150 nm, and light having a high energy wavelength such as EUV (Extreme UltraViolet, wavelength 13.5 nm), E-Beam (electron beam), etc.

In the step of forming the photoresist pattern, a negative-type pattern (e.g., negative pattern) may be formed.

The exposed region of the photoresist film has a solubility different from that of the unexposed region of the photoresist film, as a polymer is formed by a crosslinking reaction such as condensation between organometallic compounds during the exposure.

Then, a second heat treatment process is performed on the substrate. The second heat treatment process may be performed at a temperature of about 90° C. to about 200° C. By performing the second heat treatment process, the exposed region of the photoresist film becomes difficult to be dissolved in a developer solution.

For example, the photoresist pattern corresponding to the negative-type tone image (e.g., negative tone image) may be completed by dissolving and then removing the photoresist film corresponding to the unexposed region using the photoresist developer of the present embodiments.

In the present embodiments, the photoresist pattern, e.g., formed by exposure to not only light having a short wavelength such as i-line (wavelength of 365 nm), KrF excimer laser (wavelength of 248 nm), ArF excimer laser (wavelength of 193 nm), but also to EUV (light having high energy such as Extreme UltraViolet; wavelength of 13.5 nm and/or to an E-beam (electron beam)), may have a thickness width of about 5 nm to about 100 nm. For example, the photoresist pattern may be formed to have a thickness width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

In some embodiments, the photoresist pattern may have a pitch having a half-pitch of less than or equal to about 50 nm, for example less than or equal to about 40 nm, for example less than or equal to about 30 nm, for example less than or equal to about 20 nm, for example less than or equal to about 15 nm, and a line width roughness of less than or equal to about 10 nm, less than or equal to about 5 nm, less than or equal to about 3 nm, or less than or equal to about 2 nm.

Hereinafter, a method of forming patterns is described in more detail with reference to the drawings.

Figure 2:
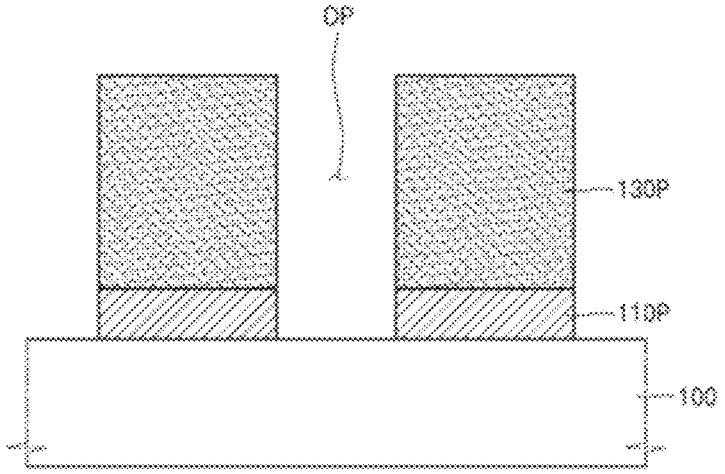
Figure 3:
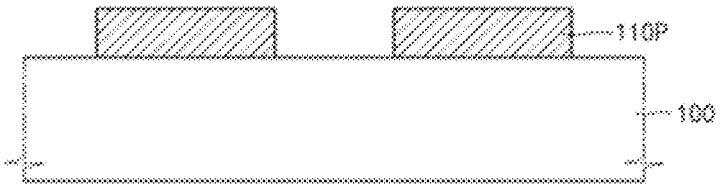

FIGS. 1 to 3 are cross-sectional views illustrating a process sequence of a method of forming patterns according to the present embodiments.

Referring to FIG. 1, the exposed photoresist film is developed to form a photoresist pattern 130P on a substrate 100.

In one or more embodiments, the exposed photoresist film may be developed to remove an unexposed region of the photoresist film, and the photoresist pattern 130P including the exposed region of the photoresist film may be formed. The photoresist pattern 130P may include a plurality of openings OP.

In one or more embodiments, the development of the photoresist film may be performed through an NTD (negative-tone development) process. Herein, the metal-containing photoresist developer composition according to one or more embodiments may be used as a developer composition.

Referring to FIG. 2, the photoresist pattern 130P is used to process a feature layer 110 in the resulting structure shown in FIG. 1.

For example, the feature layer 110 is processed through one or more suitable processes of etching the feature layer 110 exposed through the openings OP of the photoresist pattern 130P, including, for example, injecting impurity ions into the feature layer 110, forming an additional film on the feature layer 110 through the openings OP, deforming a portion of the feature layer 110 through the openings OP, and/or the like. FIG. 2 illustrates an example process of preparing a feature pattern 110P by etching the feature layer 110 exposed through the openings OP.

Referring to FIG. 3, the photoresist pattern 130P remaining on the feature pattern 110P is removed in the resulting structure shown in FIG. 2. In order to remove the photoresist pattern 130P, an ashing and stripping process may be used.

Hereinafter, the present disclosure will be described in more detail through examples relating to the preparation of the metal-containing photoresist developer composition. However, the technical features of the present disclosure are not limited by the following examples.

Preparation of Metal-Containing Photoresist Developer Composition

An organic solvent and an additive were mixed in each composition shown in Table 1 in a PP bottle, which was shaken at room temperature (25° C.) to secure complete or substantially complete dissolution. Subsequently, the obtained solutions were passed through a PTFE filter with a pore size of 1 μm, thus obtaining a developer composition.

TABLE 1

| | Developer composition | |
|---|---|---|
| | Organic solvent (wt %) [Mixing ratio (w/w)] | Additive (wt %) |
| Example 1 | MIBC (99.93) | Butyl phosphonic acid (0.07) |
| Example 2 | PGMEA/PGME (99.9) [7:3] | Methyl phosphonic acid (0.1) |
| Example 3 | PGMEA (99.99) | Vinyl phosphonic acid (0.01) |
| Example 4 | PGMEA (99.995) | Phenyl phosphonic acid (0.005) |
| Example 5 | PGMEA/PGME (99.5) [6:4] | Phosphonic acid (0.5) |
| Example 6 | PGMEA/PGME (99.98) [5:5] | Butyl phosphonic acid (0.02) |
| Example 7 | PGMEA/ethyllactate/ methyl-2-hydroxy isobutyrate (99.9) [50:15:35] | Vinyl phosphonic acid (0.1) |
| Example 8 | MIBC (99.99) | Vinyl phosphonic acid (0.01) |
| Example 9 | PGMEA (99.99) | Butyl phosphonic acid (0.01) |
| Example 10 | PGMEA/ethyllactate/ methyl-2-hydroxy isobutyrate (99.993) [50:8:42] | Butyl phosphonic acid (0.007) |
| Example 11 | PGMEA/PGME (99.9) [7:3] | Chloromethyl phosphonic acid (0.1) |
| Example 12 | PGMEA/PGME (99.9) [7:3] | 2-Chloroethyl phosphonic acid (0.1) |
| Example 13 | PGMEA/ethyllactate/ methyl-2-hydroxy isobutyrate (99.5) [50:10:40] | Acetohydroxamic acid (0.5) |
| Example 14 | PGMEA (99.5) | Salicylhydroxamic acid (0.5) |
| Example 15 | PGMEA/ethyllactate/ methyl-2-hydroxy isobutyrate (99.9) [50:20:30] | Phenylhydroxamic acid (0.1) |
| Example 16 | MIBC (99.9) | Diphenylphosphinic acid (0.1) |
| Example 17 | MIBC (99.99) | Vinylsulfonic acid (0.01) |
| Comparative Example 1 | PGMEA (99) | Oxalic acid (1) |
| Comparative Example 2 | PGMEA/PGME (97.5) [7:3] | Acetic acid (2.5) |
| Comparative Example 3 | PGMEA (100) | — |
| Comparative Example 4 | MIBC (100) | — |

Preparation of Metal-Containing Photoresist Composition

A metal-containing photoresist composition was prepared by dissolving an organometallic compound with a structure of Chemical Formula C in 4-methyl-2-pentanol at a concentration of 1 wt % and then, filtered with an 0.1 μm PTFE syringe filter.

Chemical Formula C

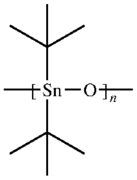

Evaluation 1: Contrast Performance

The metal-containing photoresist (PR) composition was spin-coated on an 8-inch wafer at 1,500 rpm for 30 seconds and heat-treated at 130° C. for 60 seconds, thus manufacturing a coated wafer.

After exposing the coated wafer at a dose of 10 mJ to 100 mJ in a rectangular pattern with a size of 1.2 cm×0.9 cm by using a KrF scanner (PAS 5500/700D, ASML) and heat-treating it at 170° C. for 60 seconds, the developer compositions according to Examples 1 to 17 and Comparative Examples 1 to 4 were respectively applied thereto for developing and then, heat-treated at 180° C. for 60 seconds, thus completing a patterned wafer. The patterned wafer was measured with respect to a thickness of each exposure area to obtain a contrast curve, which was used to calculate contrast (y) performance and sensitivity (Do), and the results are shown in Table 2.

$$\gamma(\text{contrast}) = 1/\log(D_{100}/D_0);$$

$D_{100}$=exposure dose at which 100% of PR begins to remain;

$D_0$=exposure dose at which PR is completely removed.

Evaluation 2: Evaluation of Sensitivity and Line Edge Roughness (LER)

A linear array of 50 circular pads with a diameter of 500 μm was projected onto a wafer by using EUV light (Lawrence Berkeley National Laboratory Micro Exposure Tool, MET). Exposure time of the pads was adjusted so that an increased dose of EUV was applied to each pad.

Subsequently, the resist and the substrate were post-exposed on a hot plate at 160° C. for 120 seconds and baked (post-exposure baked, PEB). The baked film was dipped in each developing solution according to Examples 1 to 17 and Comparative Examples 1 to 4 respectively for 30 seconds and additionally washed with the same developer for 15 seconds to form a negative tone image, that is, to remove an unexposed coating portion. Finally, the obtained film was subjected to thermal baking on a hot plate at 150° C. for 2 minutes, thus completing a process.

An ellipsometer was used to measure a residual resist thickness of the exposed pads. A residual thickness for each exposure dose was measured and graphed as a function relative to the exposure doses to evaluate $D_0$ (an energy level completed with development, e.g., sensitivity) for each type (or kind) of a resist into two stages according to the following criteria and shown in Table 2.

After measuring line edge roughness (LER) of the formed lines confirmed from FE-SEM images, the line edge roughness was evaluated into three stages according to the following criteria and shown in Table 2.

Sensitivity

A: less than 16 mJ/cm 2

B: greater than or equal to 16 mJ/$cm^2$

Line Edge Roughness (LER)

○: less than or equal to 4 nm

Δ: greater than 4 nm and less than or equal to 7 nm

X: greater than 7 nm

TABLE 2

| | γ (contrast) | Sensitivity ($D_0$) | LER |
|---|---|---|---|
| Example 1 | 35.4 | A | ○ |
| Example 2 | 37.6 | A | ○ |
| Example 3 | 31.2 | A | ○ |
| Example 4 | 29.5 | A | ○ |
| Example 5 | 40.1 | A | ○ |
| Example 6 | 32.3 | A | ○ |
| Example 7 | 38.4 | A | ○ |
| Example 8 | 31.4 | A | ○ |
| Example 9 | 33.2 | A | ○ |
| Example 10 | 30.4 | A | ○ |
| Example 11 | 39.1 | A | ○ |
| Example 12 | 39.9 | A | ○ |
| Example 13 | 29.2 | A | ○ |
| Example 14 | 27.3 | A | ○ |
| Example 15 | 33.0 | A | ○ |
| Example 16 | 35.6 | A | ○ |
| Example 17 | 35.4 | A | ○ |
| Comparative Example 1 | 23.5 | B | ○ |
| Comparative Example 2 | 22.0 | B | ○ |
| Comparative Example 3 | 11.5 | B | X |
| Comparative Example 4 | 10.7 | B | X |

* HP: Half Pitch Reference

Referring to Table 2, when the metal-containing photoresist developer compositions of Examples 1 to 17 were applied, compared with when the metal-containing photoresist developer compositions of Comparative Examples 1 to 4 were applied, excellent (improved) contrast performance, excellent (improved) sensitivity, and reduced line edge roughness were achieved.

A developing system or device for performing the developing and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Hereinbefore, the certain embodiments of the present disclosure have been described and illustrated, however, it should be apparent to a person with ordinary skill in the art that the present disclosure is not limited to the embodiments as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the present disclosure as encompassed by the following claims and their equivalents.

DESCRIPTION OF SYMBOLS

100: substrate OP: opening

110: feature layer

110P: feature pattern 130P: photoresist pattern

What is claimed is:

1. A developer composition, the developer composition comprising:

an organic solvent, and at least one additive selected from methyl phosphonic acid, ethyl phosphonic acid, butyl phosphonic acid, hexyl phosphonic acid, n-octyl phosphonic acid, tetradecyl phosphonic acid, octadecyl phosphonic acid, vinyl phosphonic acid, aminomethyl phosphonic acid, methylene diamine tetramethylene phosphonic acid, ethylene diamine tetramethylene phosphonic acid, 1-amino 1-phosphonooctyl phosphonic acid, etidronic acid, 2-aminoethyl phosphonic acid, 3-aminopropyl phosphonic acid, 6-hydroxyl hexyl phosphonic acid, decyl phosphonic acid, methylene diphosphonic acid, nitrilotrimethylene triphosphonic acid, 1H, 1H,2H,2H-perfluorooctanephosphonic acid, diphenylphosphinic acid, bis(4-methoxyphenyl) phosphinic acid, bis(hydroxymethyl) phosphinic acid, p-(3-aminopropyl)-p-butylphosphinic acid, vinylsulfonic acid, 2-propene-1-sulfonic acid, propanesulfonic acid, 3-hydroxypropane-1-sulfonic acid, 4-hydroxybenzenesulfonic acid, p-toluenesulfonic acid, and combinations thereof, wherein the additive is in an amount of about 0.0001 wt % to less than about 1.0 wt % based on the total weight of the developer composition.

2. The developer composition of claim 1, wherein the additive is in an amount of less than or equal to about 0.5 wt % based on the total weight of the developer composition.

3. The developer composition of claim 1, wherein the developer composition is for developing a film of a metal-containing photoresist, and the metal-containing photoresist comprises at least one metal compound selected from a tin compound containing an organic oxy group and a tin compound containing an organic carbonyl oxy group.

4. The developer composition of claim 1, wherein the developer composition is for developing a film of a metal-containing photoresist, and the metal-containing photoresist comprises a metal compound represented by Chemical Formula 1:

Chemical Formula 1

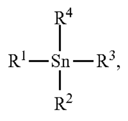

and wherein, in Chemical Formula 1, $R^1$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C7 to C31 arylalkyl group, and —$R^a$—O—$R^b$, wherein $R^a$ is a substituted or unsubstituted C1 to C20 alkylene group and $R^b$ is a substituted or unsubstituted C1 to C20 alkyl group, $R^2$ to $R^4$ are each independently selected from —$OR^c$ or —OC(=O)$R^d$, $R^c$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^d$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

5. A method of forming patterns, the method comprising:

coating a metal-containing photoresist composition for removing edge beads from a metal-containing photoresist on a substrate;

coating the metal-containing photoresist composition for removing edge beads from the metal-containing photoresist along an edge of the substrate to form a resultant;

drying and heating the resultant to form a metal-containing photoresist film, of the metal-containing photoresist, on the substrate;

exposing the metal-containing photoresist film; and developing the metal-containing photoresist film utilizing the developer composition of claim 1.

6. A patterning system for forming patterns, the system comprising:

means for coating a metal-containing photoresist composition on a substrate;

means for coating a composition for removing edge beads from a metal-containing photoresist, of the metal-containing photoresist composition, along an edge of the substrate to form a resultant;

means for drying and heating the resultant to form a metal-containing photoresist film, of the metal-containing photoresist, on the substrate;

means for exposing the metal-containing photoresist film; and means for developing the metal-containing photoresist film utilizing the developer composition of claim 1.

* * * * *